US010424529B2

(12) United States Patent
Aono et al.

(10) Patent No.: US 10,424,529 B2
(45) Date of Patent: Sep. 24, 2019

(54) CERAMIC CIRCUIT BOARD

(71) Applicant: DENKA COMPANY LIMITED, Tokyo (JP)

(72) Inventors: Ryota Aono, Omuta (JP); Kosuke Wada, Omuta (JP); Masao Tsuichihara, Omuta (JP); Takeshi Miyakawa, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 15/119,052

(22) PCT Filed: Feb. 20, 2015

(86) PCT No.: PCT/JP2015/054740
§ 371 (c)(1),
(2) Date: Aug. 15, 2016

(87) PCT Pub. No.: WO2015/125907
PCT Pub. Date: Aug. 27, 2015

(65) Prior Publication Data
US 2016/0358840 A1 Dec. 8, 2016

(30) Foreign Application Priority Data
Feb. 21, 2014 (JP) .................................. 2014-031262

(51) Int. Cl.
*H01L 23/373* (2006.01)
*C04B 37/02* (2006.01)
*B23K 35/30* (2006.01)
*H01L 23/15* (2006.01)
*H05K 1/03* (2006.01)
*H05K 3/38* (2006.01)
*C22C 5/06* (2006.01)
*C22C 49/14* (2006.01)
*C22C 49/12* (2006.01)
*C22C 5/08* (2006.01)
*H01L 23/498* (2006.01)
*B23K 35/02* (2006.01)
*H01L 35/02* (2006.01)

(52) U.S. Cl.
CPC ...... *H01L 23/3735* (2013.01); *B23K 35/0222* (2013.01); *B23K 35/0238* (2013.01); *B23K 35/0244* (2013.01); *B23K 35/3006* (2013.01); *C04B 37/026* (2013.01); *H01L 23/49866* (2013.01); *H01L 23/49877* (2013.01); *C04B 2237/124* (2013.01); *C04B 2237/125* (2013.01); *C04B 2237/126* (2013.01); *C04B 2237/127* (2013.01); *C04B 2237/368* (2013.01); *C04B 2237/407* (2013.01); *C04B 2237/60* (2013.01); *C04B 2237/74* (2013.01); *C22C 5/06* (2013.01); *C22C 5/08* (2013.01); *C22C 49/12* (2013.01); *C22C 49/14* (2013.01);

*H01L 23/15* (2013.01); *H01L 2924/0002* (2013.01); *H05K 1/0306* (2013.01); *H05K 3/388* (2013.01)

(58) Field of Classification Search
CPC .......... H01L 23/3735; H01L 23/49877; B22F 2302/40; B22F 2301/255; B22F 2301/10; B22F 2301/205; B23K 35/3006
See application file for complete search history.

(56) References Cited

U.S. PATENT DOCUMENTS

| 5,127,969 | A | * | 7/1992 | Sekhar | ............... | B23K 35/0222 |
| | | | | | | 148/23 |
| 5,495,979 | A | * | 3/1996 | Sastri | ................... | B22D 19/14 |
| | | | | | | 205/103 |
| 5,807,626 | A | | 9/1998 | Naba | | |
| 6,613,450 | B2 | * | 9/2003 | Tsukaguchi | ............. | B32B 18/00 |
| | | | | | | 228/122.1 |
| 7,219,826 | B2 | * | 5/2007 | Nakamura | .......... | H01L 23/3735 |
| | | | | | | 228/112.1 |
| 2009/0101392 | A1 | * | 4/2009 | Kaga | ....................... | H01L 23/15 |
| | | | | | | 174/252 |
| 2009/0283309 | A1 | | 11/2009 | Naba et al. | | |

FOREIGN PATENT DOCUMENTS

| CN | 1502463 A | 6/2004 |
| JP | H09-283656 A | 10/1997 |
| JP | 2003-204021 A | 7/2003 |
| JP | 2010-192656 A | 9/2010 |

OTHER PUBLICATIONS

Jin Hui Xiong, Ji Hua Huang, Hua Zhang, Xing Ke Zhao, "Brazing of carbon fiber reinforced SiC composite and TC4 using Ag—Cu—Ti active brazing alloy," Feb. 15, 2010Materials Science and Engineering A, vol. 527, iss. 4-5, pp. 1096-1101.*

(Continued)

*Primary Examiner* — Monique R Jackson
(74) *Attorney, Agent, or Firm* — Oliff PLC

(57) ABSTRACT

It is an object of the present invention to obtain a ceramic circuit substrate having high bonding strength, excellent heat cycle resistance, enhanced reliability of operation as an electronic device, and excellent heat dissipation properties. The present invention provides a ceramic circuit substrate in which metal plates, particularly copper plates, and both main surfaces of a ceramic substrate are bonded vial silver-copper brazing material layers. The silver-copper brazing material layers are formed from a silver-copper brazing material including i) 0.3-7.5 parts by mass of carbon fibers, and ii) 1.0-9.0 parts by mass of at least one active metal selected from titanium, zirconium, hafnium, niobium, tantalum, vanadium, and tin; with respect to iii) a total of 100 parts by mass of a) 75-98 parts by mass of silver powder and b) 2-25 parts by mass of copper powder. The carbon fibers having an average length of 15-400 μm, an average diameter of 5-25 μm and an average aspect ratio of 3-28.

9 Claims, No Drawings

(56) References Cited

OTHER PUBLICATIONS

Zhu, Improving the strength of brazed joints to alumina by adding carbon fibers, 1997, Journal of Materials Science 32, pp. 5321-5333. (Year: 1997).*
Cao, Carbon Fiber Silver-Copper Brazing Filler Composites for Brazing Ceramics, 1992, Welding Research Supplement, pp. 21-s-24-s. (Year: 1992).*
Nascimento, Review Article: Recent advances in metal-ceramic brazing, 2003, Ceramica, vol. 49, pp. 178-198. (Year: 2003).*
Lee, Effects of the relative contents of silver and copper on the interfacial reactions and bond strength in the active brazing of SiC, 1993, Journal of Materials Science, vol. 28, pp. 1765-1774. (Year: 1993).*
Zhu Mingguang et al. "Active Brazing Alloy Containing Carbon Fibers for Metal-Ceramic Joining" Journal of American Ceramic Society; 1994; vol. 77, No. 10; pp. 2712-20.
Lin Guobiao et al. "Joints of carbon fiber-reinforced SiC composites to Ti-alloy brazed by Ag—Cu—Ti short carbon fibers" Journal of Materials Processing Technology; 2007; vol. 189; pp. 256-261.
May 19, 2015 International Search Report issued in International Patent Application No. PCT/JP2015/054740.
Aug. 1, 2017 Extended Search Report issued in European Application No. 15752710.2.

* cited by examiner ically bonds with. N of the nitride ceramic substrate to farm TiN (titanium nitride), and
CERAMIC CIRCUIT BOARD

TECHNICAL FIELD

The present invention is directed to a ceramic circuit substrate having high bond strength and excellent heat cycle resistance properties.

BACKGROUND ART

As circuit substrates used in power modules and the like, from the viewpoints of thermal conductivity, costs, and safety, ceramic substances such as those of alumina, beryllia, silicon nitride, and aluminum nitride are used. These ceramic substrates are used as circuit substrates wherein metal circuit boards such as copper and aluminum and heat dissipation plates are bonded. Those have excellent insulative properties and heat dissipation compared with rosin substrates and metal substrates using resin layers as insulative materials, so they are used as substrates for loading high heat dissipation electronic components.

Ceramic circuit substrates wherein a metal circuit board is bonded to the surface of a ceramic substrate with a brazing material and a semiconductor element is loaded onto a predetermined position of the metal circuit hoard are used in power module applications such as elevators, vehicles, and hybrid cars. In recent years, with respect to the increase of heat quantity from semiconductor elements accompanying the high integration, frequency, and output of semiconductor elements, ceramic substrates of aluminum nitride sintered bodies and silicon nitride sintered bodies having high thermal conductivity are used. In particular, aluminum nitride substrates, when compared to silicon nitride substrates, have high thermal conductivity, so they are favorable as ceramic circuit substrates for loading high heat dissipation electronic components.

However, aluminum nitride substrates, while having high thermal conductivity, also have low mechanical strength and toughness, so problems such as cracks occurring because of the tightening at the assembly step and the easy formation of cracks when heat cycles are applied remain. In particular, when used in power modules applied under severe loads and thermal conditions such as those for motor vehicles and electric railways and machine tools and robots, such problems become readily evident.

For this reason, as ceramic substrates for loading electronic components, improvements of mechanical reliability are required, so silicon nitride substrates, though inferior to aluminum nitride substrates in terms of thermal conductivity, have been focused on for having excellent mechanical strength and toughness.

Ceramic circuit substrates making use of silicon nitride substrates are manufactured with, for example, the following active metal method.

The active metal method bonds metal plates on a ceramic substrate via a brazing material layer that includes active metals such as 4A group elements and 5A group elements, and normally, screen prints a silver-copper-titanium brazing material on both main surfaces of a silicon nitride substrate, wherein on these printed surfaces, a metal circuit board and as metal heat dissipation plate are disposed, and wherein, by performing a heating treatment at an appropriate temperature, the ceramic substrate and the metal plates are bonded.

With as thus obtained ceramic circuit substrate, since Ti, which is an active metal, covalently bonds with. N of the nitride ceramic substrate to farm TiN (titanium nitride), and a bonding layer is formed with this TiN, it is possible to obtain a relatively high bonding strength.

On the other hand, in semiconductor modules to be equipped on a vehicle, high output and high integration are progressing, and the thermal stress that repeatedly acts on ceramic circuit substrates tends to increase even more. Once this thermal stress cannot be endured, microscopic cracks occur on the ceramic substrate. In cases where heat load cycles continue to be applied with these microscopic, cracks, the metal plates separate from the ceramic substrate, leading to bonding strength insufficiencies or thermal resistance insufficiencies. As a result, there are problems with the operational reliability as an electronic instrument declining. From such issues, the following have been proposed concerning brazing material constitutions for ceramic circuit substrates that can withstand thermal stress.

Patent Document 1, directed to improving heat cycle resistance properties for ceramic circuit substrates, describes the inclusion of carbon powder in the brazing material for bonding a ceramic substrate and metal plates as being effective.

Patent Document 1: JP H9-283656 A

SUMMARY OF THE INVENTION

However, for recent semiconductor modules to be equipped on vehicles, even higher output and higher integration are rapidly progressing, and ceramic circuit substrates are required to have the structure consisting of a thick metal plate so as to improve heat dissipation and a thin ceramic substrate so as to reduce thermal resistance. With thick metal plates, the thermal stress caused by a difference of thermal expansion coefficients occurring at the bonded interface of the ceramic substrate and the metal plates becomes even more intense, so when heat cycles are applied, becomes easy for microscopic cracks to occur on the ceramic substrate.

Further, heat cycle assessment for assessing heat cycle properties, normally, is carried out within a temperature range of −40 degrees Celsius to 125 degrees Celsius, but in the future, as promising next-generation power devices, with devices equipped with wide band gap semiconductors such as SiC and GaN, operational temperatures will increase, meaning thermal stress will continue to grow, Even when ceramic substrates are silicon nitride substrates, and when ceramic circuit substrates include carbon powder in the brazing material layer such as those described in Patent Document 1, such problems have not been satisfactorily solved.

Further, even among carbon components consisting of the same carbon atoms, such as graphite powder and diamond powder, the non-fibrous carbon powder included in the brazing material has low thermal conductivity, so there is the unfavorable possibility of impeding the heat dissipation of the ceramic circuit substrate.

The object of the present invention, in view of the above problems, is obtaining a ceramic circuit substrate having high bonding strength and excellent heat cycle resistance, as well as excellent heat dissipation and improved operational reliability as an electronic instrument.

The present inventors, as a result of serious consideration provided in order to achieve the foregoing, discovered that by approximating the thermal expansion coefficient of a brazing material for bonding a ceramic substrate and metal plates to the ceramic substrate, the heat cycle resistance of the circuit substrate can be improved. Further, by using carbon fiber as the carbon component included in the brazing material, it was discovered that it is possible to obtain a ceramic circuit substrate having excellent heat dissipation leading to the completion of the present invention.

That is, the present invention is directed to a ceramic circuit substrate wherein both main surfaces of a ceramic substrate and the metal plates are bonded via a silver-copper brazing material layer, characterized in that the silver-copper brazing material layer is formed from a silver-copper brazing material including 0.3-7.5 parts by mass of carbon fibers and 1.0-9.0 parts by mass of at least one active metal selected from titanium, zirconium, hafnium, niobium, tantalum, vanadium, and tin with respect to 78-98 parts by mass of silver powder and 2-25 parts by mass of copper powder totaling 100 parts by mass, with the carbon fibers having an average length of 15-400 μm, an average diameter of at most 5-25 μm, and an average aspect ratio of 3-28.

By "both main surfaces of a ceramic substrate and metal plates bonded via a silver-copper brazing material layer," the intended meaning is that the metal plates are respectively bonded to the two main surfaces of the ceramic substrate via a silver-copper brazing material layer.

According to the present invention, it is possible to manufacture a silicon nitride circuit substrate having strong bonding characteristic and a crack rate of less than 1% in 2,000 cycles of heat cycle tests of -40 degrees Celsius to 150 degrees Celsius.

MODES FOR CARRYING OUT THE INVENTION

As a ceramic substrate used in the ceramic circuit substrate according to the present invention, while there are no particular limitations, nitride-based ceramics such as silicon nitride and aluminum nitride, oxide-based ceramics such as aluminum oxide and zirconium oxide, carbide-based ceramics such as silicon carbide, and boride-based ceramics such as lanthanum boride can be used. However, in order to bond the metal plates to the ceramic substrate are with active metal method, non-oxide ceramics such as aluminum nitride and silicon nitride are favorable, and further, from viewpoints of excellent mechanical strength and fracture toughness, silicon nitride substrates are favorable.

While there are no particular limitations concerning the thickness of the ceramic substrate according to the present invention, approximately 0.1-3.0 mm is normal, and in particular, when considering, reduction of thermal resistivity of the entirety of the circuit substrate, a thickness of at most 1.0 mm is preferable, with a thickness of at most 0.4 mm being more preferable.

The metal used in the metal plates of the present invention is not particularly limited provided it is a metal that can be used with active metal method, such as a simplex or alloy of copper, aluminum, iron, nickel silver, molybdenum, cobalt though from the viewpoints of conductivity and heat dissipation in particular, copper plates are preferable.

The purity of the copper plates of the present invention is preferably at least 90%, and in cases where the purity is less than 90%, when bonding the ceramic substrate and the copper plates, the reaction between the copper plates and the brazing material becomes insufficient, the copper plates become hard, and the reliability of the circuit substrate drops in some cases.

While there are no particular limitations concerning the thickness of the copper plates of the present invention, 0.1-1.5 mm is normal, and in particular, from the viewpoint of heat dissipation, thickness of at least 0.3 mm is preferable, with a thickness of at least 0.5 mm being more preferable.

The brazing material layer cit the present invention is formed from a silver-copper brazing material comprising carbon fibers and at least one type of active metal selected from titanium, zirconium, hafnium, niobium, tantalum, vanadium, and tin. It is preferable to set the compositional ratio of the silver-copper brazing material to a compositional ratio making it easy to generate a eutectic composition, and in particular, a composition taking the weld penetration of the copper from the copper plate and the heat dissipation copper plate is preferable. In the total of 100 parts by mass of the silver powder and the copper powder, it is preferable for the silver powder to be 75-98 parts by mass and for the copper powder to be 2-25 parts by mass. In eases where the amount of the silver powder is other than 75-98 parts b mass, the melting temperature of the brazing material increases, leading to an increase in the thermal stress originating from the difference of thermal expansion coefficient when bonding, this leading to a tendency for a drop in heat cycle resistance.

The amount of the carbon fibers included in the brazing material forming the brazing material layer of the present invention is preferably 0.3-7.5 parts by mass and more preferably, 0.5-3.5 parts by mass, with respect to the total of 100 parts by mass of the 75-98 parts by mass of silver powder and the 2-25 parts by mass of copper powder. In cases where the blending amount of the carbon fibers is less than 0.3 parts by mass, the reduction in the thermal expansion coefficient of the brazing material is small, leading to a small improvement of the heat cycle properties of the circuit substrate. On the other hand, in cases where the blending amount is greater than 7.5 parts by mass, there is an unfavorable drop in the bonding strength of the ceramic substrate and the metal plates.

The carbon fibers preferably have an average length of 15-400 μm, an average diameter of 5-25 μm, and an average aspect ratio of 3-28. More preferably, the carbon fibers have an average length of 22-160 μm, an average diameter of 7.5-10 μm, and an average aspect ratio of 4-10. If the average length is greater than 400 μm, if the average diameter is greater than 25 μm, and if the average aspect ratio is greater than 28, it becomes difficult to disperse evenly in the brazing material paste. In addition, if the average length is less than 15 μm, if the average diameter is less than 5 μm, and if the average aspect ratio is less than 4, then the bonding strength of the ceramic substrate and the metal plates unfavorably drops.

In the present invention, "average length" means an average value of values obtained by using a scanning electron microscope to observe at least 20 carbon fibers and measure the length of each fiber with image analysis, "Average diameter" means an average value of values obtained by using a scanning electron microscope to observe at least 20 carbon fibers and measure the diameter of each fiber with image analysis, "Average aspect ratio" means a value obtained by dividing the "average length" by the "average diameter."

The types of carbon fibers can be pitch-based carbon fibers or poly acrylonitrile-based carbon fibers. In addition, it is well known that the physicochemical behavior and mechanical properties are completely different among carbon components consisting of the same carbon atoms, such as carbon fibers, carbon components included, in organic binders and organic solvents, carbon powders, and diamonds. However, for example, the thermal conductivity of non-fibrous carbon powders is low, so there is the unfavorable possibility of inhibiting the heat dissipation of the ceramic circuit substrate. Furthermore, in occasions, the heat cycle resistance properties unfavorably decline. In addition, with diamond powders, while thermal conductivity is excellent, the costs are unfavorably high.

The amount of the active metal included in the brazing material forming the brazing material layer is preferably 1.0-9.0 parts by mass, and more preferably 3.0-5.5 parts by mass, with respect to a total of 100 parts by mass of 72 parts by mass of the silver powder and 28 parts by mass of the copper powder. In cases where the blended amount of the active metal is less than 1.0 parts by mass, the wettability of the ceramic substrate and the brazing material is not good, leading to the easy occurrence of bonding deficiencies. On the other hand, if the blending amount of the active metal is greater than 9 parts per mass, the fragile nitride layer of the active metal formed at the bonding interfaces becomes excessive, and the heat cycle resistance unfavorably declines. Further, while the active metal can be selected from metals such as titanium, zirconium, hafnium, niobium, tantalum, vanadium, and tin, of these, titanium is preferable.

The thickness of the brazing material applied for forming the brazing material layer is preferably 5-40 μm on a dry basis, if the thickness of the brazing material is less than 5 μm, there are instances of un-reacting portions, but on the other hand, in cases where the thickness of the brazing material is greater than 40 μm, the time for removing the bonding layer becomes long, leading to cases of a drop in productivity. While there are no particular limitations concerning the application method, it is possible to employ conventionally-known application methods capable of uniformly applying to the surface of the substrate such as screen printing and roll coating.

With respect to the bonding of the ceramic substrate and the metal plates, they are preferably bonded in vacuum at 780 degrees Celsius to 875 degrees Celsius and at ten to 60 minutes. In cases where the bonding temperature is less than 780 degrees, or in cases where the bonding time is fewer than ten minutes, the bonding characteristics of the ceramic substrate and the brazing material drop. On the other hand, in cases where the bonding temperature is greater than 875 degrees Celsius, or in cases where the bonding time is more then 60 minutes, thermal stress originating from differences of thermal expansion coefficients during bonding increases, and heat cycle resistance drops easily.

In order to form circuit patterns on the circuit substrate, an etching resist is applied on the metal plate and etching is performed. There are no particular limitations concerning the etching resist, and for example, normally-used ultraviolet curing types and thermal curing types can be used. There are no particular limitations concerning the application method of the etching resist, and conventionally known application methods such as screen printing can be employed.

In order to form the circuit patterns, an etching process of the copper plate is performed. While there are no particular limitations concerning the etching solution, and normally-used etching solutions such as a ferric chloride solution or a cupric chloride solution, sulfuric acid, and a hydrogen peroxide solution can be used, a ferric chloride solution or a cupric chloride solution is preferable. A nitride ceramic circuit substrate having had unnecessary metal portions removed via etching has the applied brazing material, the alloy layer thereof, and nitride layer remaining, and normally, a solution comprising an ammonium halide aqueous solution, an inorganic acid such as nitric acid and sulfuric acid, and a hydrogen peroxide solution is used to remove these. After circuit formation, separation of the etching resist is performed, and while there are no particular limitations concerning the separation method, methods for immersing in an alkali aqueous solution are normal.

EXAMPLES

Example 1

An active metal brazing material comprising carbon fibers (made by Nippon Graphite Fiber Corporation: XN-100-15M) having an average length of 120 μm, an average diameter of 15 μm, and an average aspect ratio of 8 at 1.5 parts by mass and titanium (made by Osaka Titanium Technologies Co., Ltd: TSH-350) at 3.5 parts by mass with respect to a total of 100 parts by mass of a silver powder (made by Fukuda Metal Foil & Powder Co., LTD: AgC-BO) at 90 parts by mass and a copper powder (made by Fukuda Metal Foil & Powder Co., LTD: SRC-Cu-20) at 10 parts by mass was applied to both main surfaces of a silicon nitride substrate having a thickness of 0.25 mm, and oxygen-free copper plates having a thickness of 1.0 mm and 1.0 mm were respectively bonded to the circuit surface and the rear surface in a vacuum at 830 degrees Celsius for 20 minutes.

The bonded circuit substrate was etched with an etching solution including copper chloride and circuits were formed. Further, the brazing material layer was etched with an etching solution of ammonium fluoride/hydrogen peroxide, and the silicon nitride circuit substrate was manufactured.

The bonding characteristics of the copper plates and the silicon nitride substrate and the heat cycle resistance of the circuit substrate were assessed with the following methods.

<Bonding Characteristics of the Copper Plates and the Silicon Nitride Substrate>

The bonding characteristics of the copper plates and the silicon nitride substrate were assessed with a peel strength measurement. The measurement method was as follows an edge of a pattern having a 5 mm width, this being a portion of the copper circuit pattern bonded to the silicon nitride substrate, was torn off with pliers, this bonded substrate was secured on a pedestal of a tension testing apparatus, and the edge of the pattern was attached to a chuck of a pull testing apparatus. At this time, these were arranged such that the angle of the surface of the silicon nitride substrate and the torn copper circuit pattern was 90 degrees (vertical direction). Subsequently, the tension testing apparatus was operated, the torn pattern was pulled and moved upwards via the chuck, and the maximum pealing load at this time was measured. The maximum peeling load was divided by a width (0.5 cm) and the bonding strength was measured. The results are displayed in Table 3.

<Assessment of the Heat Cycle Resistance>

The manufactured silicon nitride substrate was subjected to a heat cycle resistance test wherein one cycle was set at −40 degrees Celsius for 30 minutes, 25 degrees Celsius for 10 minutes, 150 degrees Celsius for 30 minutes, and 25 degrees Celsius for 10 minutes for 2001) repeated cycles. Subsequently, the copper plates and the brazing material layer were separated from the silicon nitride circuit substrate by using a copper chloride solution and an etching solution of ammonium fluoride/hydrogen peroxide, a horizontal crack area of the surface of the silicon nitride substrate was binarized and calculated with an image analysis software GIMP 2 (threshold value of 140), following which, a crack rate (%) was calculated from the horizontal crack area/area of circuit pattern (that is, a ratio of the horizontal crack area to the circuit pattern area). The results are displayed in Table 3.

As displayed in Table 3, when bonding the copper plates to the silicon nitride substrate, by using a blend comprising carbon fibers having an average length of 120 μm, an average diameter of at most 15 μm, and an average aspect ratio of 8 at 1.5 parts by mass and titanium at 3.5 parts by mass with respect to a total of 100 parts by mass of a silver powder at 90 parts by mass and a copper powder at 10 parts by mass, and bonding at 780-875 degrees Celsius for 10-60 minutes like in Example 1, a circuit substrate having a crack rate of 0.01% assessed with the heat cycle resistance, without reducing the bonding characteristics, was obtained, thus establishing that circuit substrates having a crack rate of at most 1% can be obtained.

Examples 2-24 and Comparative Examples 1-13

Aside from changing the conditions displayed in Tables 1 and 2, these were conducted in the same way as Example 1. Further, in Comparative Example 13, in place of carbon fibers, non-fibrous carbon particles were used. The assessments of the bonding characteristics of the copper plates and the silicon nitride substrate and the heat cycle resistance were performed in the same way as Example 1. The results are displayed in Tables 3 and 4.

TABLE 1

| | Brazing Material Composition | | | | | | | | Structural Member Thickness | |
|---|---|---|---|---|---|---|---|---|---|---|
| | | | Carbon Fiber | | | | Active Metal | | | |
| | | | Blending | | | | | Blending | | |
| No. | Ag (Parts by mass) | Cu (Parts by mass) | amount (Parts by mass) | Length (μm) | Diameter (μm) | Aspect Ratio | Type | amount (Parts by mass) | Silicon Nitride mm | Copper mm |
| Example 1 | 90 | 10 | 1.5 | 120 | 15 | 8 | Ti | 3.5 | 0.25 | 1 |
| Example 2 | 95 | 5 | 1.5 | 120 | 15 | 8 | Ti | 3.5 | 0.25 | 1 |
| Example 3 | 77 | 25 | 1.5 | 120 | 15 | 8 | Ti | 3.5 | 0.25 | 1 |
| Example 4 | 90 | 10 | 1.5 | 120 | 15 | 8 | Ti | 1.5 | 0.25 | 1 |
| Example 5 | 90 | 10 | 1.5 | 120 | 15 | 8 | Ti | 5.5 | 0.25 | 1 |
| Example 6 | 90 | 10 | 1.5 | 120 | 15 | 8 | Ti | 8 | 0.25 | 1 |
| Example 7 | 90 | 10 | 0.5 | 120 | 15 | 8 | Ti | 3.5 | 0.25 | 1 |
| Example 8 | 90 | 10 | 3.5 | 120 | 15 | 8 | Ti | 3.5 | 0.25 | 1 |
| Example 9 | 90 | 10 | 6.5 | 120 | 15 | 8 | Ti | 3.5 | 0.25 | 1 |
| Example 10 | 90 | 10 | 1.5 | 360 | 15 | 24 | Ti | 3.5 | 0.25 | 1 |
| Example 11 | 90 | 10 | 1.5 | 45 | 15 | 3 | Ti | 3.5 | 0.25 | 1 |
| Example 12 | 90 | 10 | 1.5 | 120 | 8 | 15 | Ti | 3.5 | 0.25 | 1 |
| Example 13 | 90 | 10 | 1.5 | 120 | 20 | 6 | Ti | 3.5 | 0.25 | 1 |
| Example 14 | 90 | 10 | 1.5 | 24 | 8 | 3 | Ti | 3.5 | 0.25 | 1 |
| Example 15 | 90 | 10 | 1.5 | 160 | 8 | 20 | Ti | 3.5 | 0.25 | 1 |
| Example 19 | 90 | 10 | 1.5 | 120 | 15 | 8 | Ti | 3.5 | 0.25 | 1 |
| Example 20 | 90 | 10 | 1.5 | 120 | 15 | 8 | Ti | 3.5 | 0.25 | 1 |
| Example 21 | 90 | 10 | 1.5 | 120 | 15 | 8 | Ti | 3.5 | 0.25 | 1 |
| Example 22 | 90 | 10 | 1.5 | 120 | 15 | 8 | Ti | 3.5 | 0.25 | 1 |
| Example 23 | 90 | 10 | 1.5 | 120 | 15 | 8 | Ti | 3.5 | 0.4 | 1 |
| Example 24 | 90 | 10 | 1.5 | 120 | 15 | 8 | Ti | 3.5 | 0.25 | 0.5 |

TABLE 2

| | Brazing Material Composition | | | | | | | | Structural Member Thickness | |
|---|---|---|---|---|---|---|---|---|---|---|
| | | | Carbon Fiber | | | | Active Metal | | | |
| | | | Blending | | | | | Blending | | |
| No. | Ag (Parts by mass) | Cu (Parts by mass) | amount (Parts by mass) | Length (μm) | Diameter (μm) | Aspect Ratio | Type | amount (Parts by mass) | Silicon Nitride mm | Copper mm |
| Comparative Example 1 | 99 | 1 | 1.5 | 120 | 15 | 8 | Ti | 3.5 | 0.25 | 1 |
| Comparative Example 2 | 99 | 1 | 1.5 | 120 | 15 | 8 | Ti | 3.5 | 0.25 | 1 |
| Comparative Example 3 | 70 | 30 | 1.5 | 120 | 15 | 8 | Ti | 3.5 | 0.25 | 1 |
| Comparative Example 4 | 70 | 30 | 1.5 | 120 | 15 | 8 | Ti | 3.5 | 0.25 | 1 |
| Comparative Example 5 | 90 | 10 | 1.5 | 120 | 15 | 8 | Ti | 0.5 | 0.25 | 1 |
| Comparative Example 6 | 90 | 10 | 1.5 | 120 | 15 | 8 | Ti | 12 | 0.25 | 1 |
| Comparative Example 7 | 90 | 10 | 0.1 | 120 | 15 | 8 | Ti | 3.5 | 0.25 | 1 |
| Comparative Example 8 | 90 | 10 | 8 | 120 | 15 | 8 | Ti | 3.5 | 0.25 | 1 |

TABLE 2-continued

| | Brazing Material Composition | | | | | | | Structural Member Thickness | |
|---|---|---|---|---|---|---|---|---|---|
| | | | Carbon Fiber | | | | Active Metal | | |
| | | | Blending | | | | | Blending | Silicon | |
| No. | Ag (Parts by mass) | Cu (Parts by mass) | amount (Parts by mass) | Length (μm) | Diameter (μm) | Aspect Ratio | Type | amount (Parts by mass) | Nitride mm | Copper mm |
| Comparative Example 9 | 90 | 10 | 1.5 | 450 | 15 | 35 | Ti | 3.5 | 0.25 | 1 |
| Comparative Example 10 | 90 | 10 | 1.5 | 35 | 15 | 2 | Ti | 3.5 | 0.25 | 1 |
| Comparative Example 11 | 90 | 10 | 1.5 | 120 | 3 | 40 | Ti | 3.5 | 0.25 | 1 |
| Comparative Example 12 | 90 | 10 | 1.5 | 120 | 30 | 4 | Ti | 3.5 | 0.25 | 1 |
| Comparative Example 13 | 90 | 10 | 1.5 (carbon) | — | 15 | — | Ti | 3.5 | 0.25 | 1 |

TABLE 3

| No. | Bonding Temperature °C. | Bonding Time Minutes | Bonding Characteristics N/cm | Crack rate % | Thermal Resistance °C./W |
|---|---|---|---|---|---|
| Example 1 | 830 | 20 | 180 | 0.01 | 0.19 |
| Example 2 | 835 | 20 | 160 | 0.39 | 0.19 |
| Example 3 | 840 | 20 | 165 | 0.35 | 0.19 |
| Example 4 | 830 | 20 | 141 | 0.56 | 0.19 |
| Example 5 | 830 | 20 | 193 | 0.35 | 0.19 |
| Example 6 | 830 | 20 | 208 | 0.68 | 0.19 |
| Example 7 | 830 | 20 | 192 | 0.46 | 0.19 |
| Example 8 | 830 | 20 | 176 | 0.05 | 0.19 |
| Example 9 | 830 | 20 | 162 | 0.53 | 0.19 |
| Example 10 | 830 | 20 | 155 | 0.40 | 0.19 |
| Example 11 | 830 | 20 | 185 | 0.01 | 0.19 |
| Example 12 | 830 | 20 | 150 | 0.01 | 0.19 |
| Example 13 | 830 | 20 | 173 | 0.22 | 0.19 |
| Example 14 | 830 | 20 | 185 | 0.01 | 0.2 |
| Example 15 | 830 | 20 | 151 | 0.41 | 0.21 |
| Example 19 | 865 | 20 | 196 | 0.22 | 0.19 |
| Example 20 | 790 | 20 | 166 | 0.18 | 0.19 |
| Example 21 | 830 | 10 | 170 | 0.07 | 0.19 |
| Example 22 | 830 | 55 | 208 | 0.09 | 0.19 |
| Example 23 | 830 | 20 | 188 | 0.01 | 0.28 |
| Example 24 | 830 | 20 | 193 | <0.01 | 0.33 |

TABLE 4

| No. | Bonding Temperature °C. | Bonding Time Minutes | Bonding Characteristics N/cm | Crack rate % | Thermal Resistance °C./W |
|---|---|---|---|---|---|
| Comparative Example 1 | 830 | 20 | Bonding Not Possible | Bonding Not Possible | 0.19 |
| Comparative Example 2 | 880 | 20 | 145 | 2.94 | 0.19 |
| Comparative Example 3 | 830 | 20 | Bonding Not Possible | Bonding Not Possible | 0.19 |
| Comparative Example 4 | 880 | 20 | 149 | 2.32 | 0.19 |
| Comparative Example 5 | 830 | 20 | 75 | 2.86 | 0.19 |
| Comparative Example 6 | 830 | 20 | 235 | 2.45 | 0.19 |
| Comparative Example 7 | 830 | 20 | 192 | 1.4 | 0.19 |
| Comparative Example 8 | 830 | 20 | 70 | 2.99 | 0.19 |
| Comparative Example 9 | 830 | 20 | 110 | 2.50 | 0.19 |
| Comparative Example 10 | 830 | 20 | 102 | 2.40 | 0.19 |
| Comparative Example 11 | 830 | 20 | 98 | 2.40 | 0.19 |
| Compatative Example 12 | 830 | 20 | 84 | 2.40 | 0.19 |
| Comparative Example 13 | 830 | 20 | 199 | 1.01 | 0.23 |

From Tables 3 and 4, when bonding the copper plates to the silicon nitride substrate, by using a blend comparing carbon fibers having an average length of 15-400 μm, an average diameter of 5-25 μm, and an average aspect ratio of 3-28 at 0.3-7.5 parts by mass and at least one active metal selected from titanium, zirconium, hafnium, niobium, tantalum, vanadium, and tin at 1.0-9.0 parts by mass with respect to a total of 100 parts by mass of a silver powder at 75-98 parts by mass and a copper powder at 2-25 parts by mass, and bonding at 780-875 degrees Celsius for 10-60 minutes, a circuit substrate having a crack rate of at most 1% assessed with the heat cycle resistance, without reducing the bonding characteristics, was obtained.

The invention claimed is:

1. A ceramic circuit substrate comprising two main surfaces bonded to a copper metal plate via a silver-copper brazing material layer,
wherein the silver-copper brazing material layer is formed from a silver-copper brazing material comprising carbon fibers in a range of 0.3-7.5 parts by mass and at least one active metal selected from the group consisting of titanium, zirconium, hafnium, niobium, tantalum, vanadium, and tin in a range of 1.0-9.0 parts by mass with respect to a total of 100 parts by mass of a silver powder in a range of 75-98 parts by mass and a copper powder in a range of 2-25 parts by mass,
the carbon fibers have an average length in a range of 15-400 μm, an average diameter in a range of 5-25 μm, and an average aspect ratio in a range of 3-28, and the ceramic substrate has a thickness in a range of 0.1 to 1.0 mm and the metal plate has a thickness in a range of 1.0 to 1.5 mm.

2. The ceramic circuit substrate of claim 1, wherein the carbon fibers have an average length in a range of 15-160 μm and an average aspect ratio in a range of 3-8.

3. The ceramic circuit substrate of claim 1, wherein the carbon fibers have an average length in a range of 22-160 μm, an average diameter in a range of 7.5-25 μm, and an average aspect ratio in a range of 3-8.

4. The ceramic circuit substrate of claim 1, wherein the ceramic substrate comprises at least one selected from the group consisting of silicon nitride, zirconium oxide, silicon carbide and lanthanum boride.

5. The ceramic circuit substrate of claim 1, wherein the carbon fibers have an average aspect ratio in a range of 3-24.

6. The ceramic circuit substrate of claim 1, wherein the carbon fibers have an average aspect ratio in a range of 8-28.

7. The ceramic circuit substrate of claim 1, wherein the carbon fibers have an average aspect ratio in a range of 15-28.

8. The ceramic circuit substrate of claim 1, wherein the carbon fibers have an average length in a range of 120-360 μm, an average diameter in a range of 8-20 μm, and an average aspect ratio in a range of 3-24.

9. A ceramic circuit substrate comprising two main surfaces bonded to a copper metal plate via a silver-copper brazing material layer,
wherein the silver-copper brazing material layer is formed from a silver-copper brazing material comprising carbon fibers in a range of 0.3-7.5 parts by mass and titanium in a range of 1.0-9.0 parts by mass with respect to a total of 100 parts by mass of a silver powder in a range of 75-98 parts by mass and a copper powder in a range of 2-25 parts by mass,
the carbon fibers have an average length in a range of 15-400 μm, an average diameter in a range of 5-25 μm, and an average aspect ratio in a range of 3-28,
a ceramic used in the ceramic circuit substrate is selected from the group consisting of silicon nitride, aluminum nitride, aluminum oxide, zirconium oxide, silicon carbide, and lanthanum boride.

* * * * *